Figure 1:
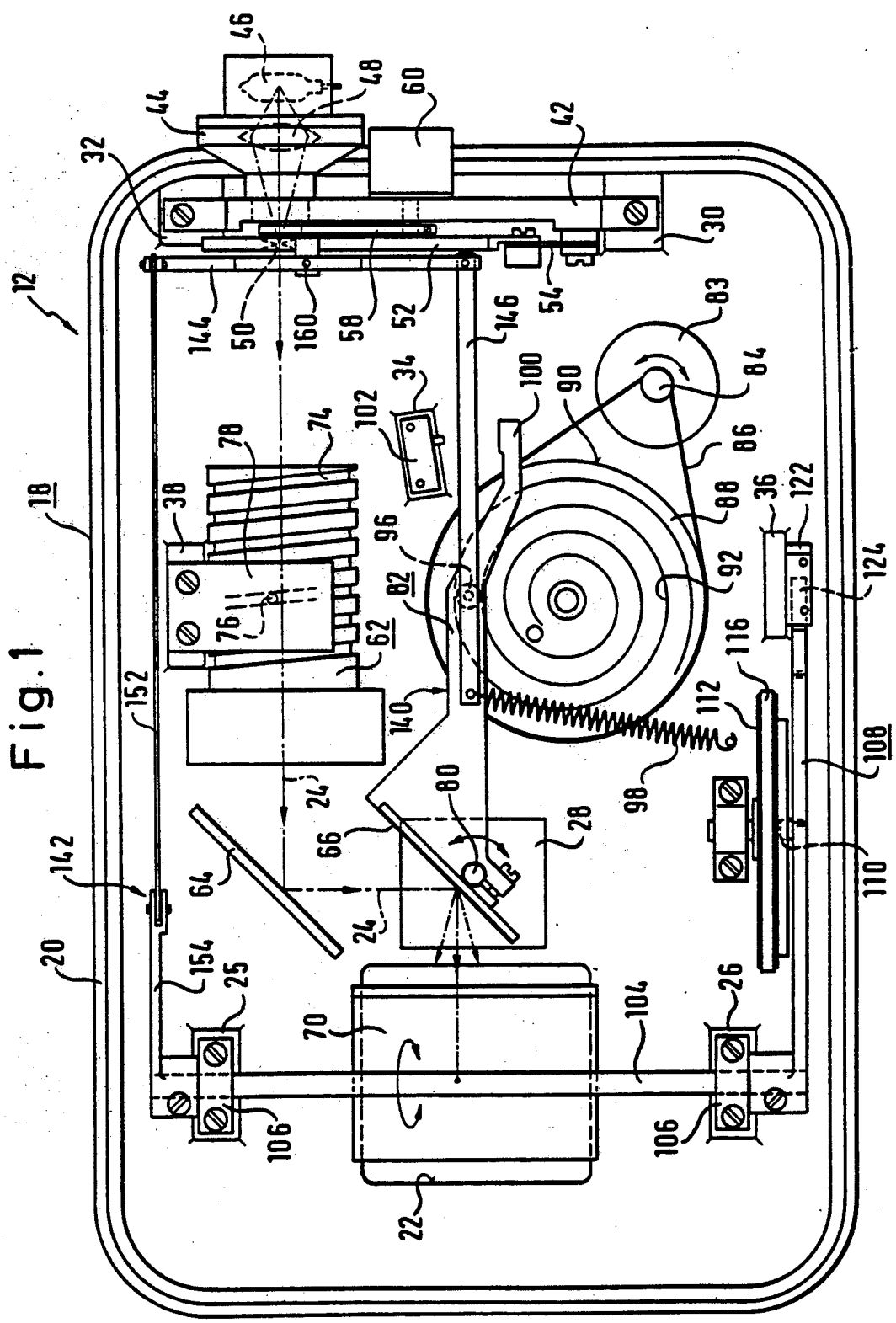

United States Patent [19]

Stückler

[11] Patent Number: 5,196,875
[45] Date of Patent: Mar. 23, 1993

[54] PROJECTION HEAD

[75] Inventor: Gerd Stückler, Tegernsee, Fed. Rep. of Germany

[73] Assignee: RoyoCad Gesellschaft für Hard-und Software mbH, Ebersberg, Fed. Rep. of Germany

[21] Appl. No.: 640,378
[22] PCT Filed: Jun. 15, 1989
[86] PCT No.: PCT/EP89/00676
§ 371 Date: Feb. 1, 1991
§ 102(e) Date: Feb. 1, 1991
[87] PCT Pub. No.: WO90/01862
PCT Pub. Date: Feb. 22, 1990

[30] Foreign Application Priority Data

Aug. 3, 1988 [DE] Fed. Rep. of Germany ....... 3826442

[51] Int. Cl.$^5$ .......................................... G02B 26/08
[52] U.S. Cl. ...................... 353/97; 353/122; 353/46; 359/221
[58] Field of Search .............. 353/51, 50, 46, 122, 353/28, DIG. 6, 97; 250/234, 235, 237 R; 359/198, 223, 226, 212, 221

[56] References Cited

U.S. PATENT DOCUMENTS

| | | | |
|---|---|---|---|
| 3,993,402 | 11/1976 | Fredrick, Jr. ................. | 359/226 |
| 4,102,568 | 7/1978 | Miyagi ............................ | 353/28 |
| 4,256,364 | 3/1981 | Minoura et al. ............... | 358/221 |
| 4,314,154 | 2/1982 | Minoura et al. ............... | 359/221 |
| 4,869,583 | 9/1989 | Tiedje ............................ | 359/223 |
| 4,941,739 | 7/1990 | Grudic et al. .................. | 359/223 |
| 5,048,904 | 9/1991 | Montagu ........................ | 359/221 |

FOREIGN PATENT DOCUMENTS 2716548 10/1978 Fed. Rep. of Germany .
2715651  5/1979 Fed. Rep. of Germany .
8804121  6/1988 World Int. Prop. O. .

Primary Examiner—William A. Cuchlinski, Jr.
Assistant Examiner—William C. Dowling
Attorney, Agent, or Firm—Anderson Kill Olick & Oshinsky

[57] ABSTRACT

A projection head for a light point on an assembly surface of an assembly table for indicating the outfitting location comprises a carrier part, an approximately punctiform light source, a holder for the point light source, which holder is arranged at the carrier part, as well as imaging optics which are arranged at the carrier part and comprise at least one optical element, which is arranged at the carrier part so as to be movable, for shifting the light point, as desired, on the assembly surface. In order to obtain a sharp-edged light point imaging on the entire assembly surface in a simple construction, it is provided that the imaging optics comprise an imaging lens or lens group which is arranged at the carrier part in a stationary manner, wherein the optical element, of which there is at least one, is supported at the carrier part so as to be swivelable, and wherein the light source holder, including the point light source, is further constructed in such a way that it can be deflected relative to the carrier part in the direction of the optical axis as a function of the respective swivel angle of the optical element, of which there is at least one.

22 Claims, 2 Drawing Sheets

PROJECTION HEAD

The invention is directed to a projection head for a light point on a surface, particularly an assembly surface of an assembly table, for indicating the outfitting location, comprising a carrier part, a point light source, particularly in the form of a pin diaphragm which is illuminated from the rear, a holder for the point light source, which holder is arranged at the carrier so as to be movable, and imaging optics arranged at the carrier part for imaging the point light source as light point on the surface with at least one optical element, which is attached to the carrier part so as to be movable, for shifting the light point on the surface, as desired.

A projection head of this type is known from DE-C-27 16 548. The entire lens system or objective 26 is movable linearly in two directions X and Y perpendicular to one another and to the optical axis for the corresponding light point movement on the surface. A holder 16 for the punctiform light source in the form of a pin diaphragm 24, as well as for the rear pin diaphragm illumination 20, is supported at the projection head in the manner of a ball joint, the swivel point of the joint being situated in the aperture of the pin diaphragm. The tubular holder is carried along by the objective via a drag coupling. A sufficient illumination of the pin diaphragm, as well as of the entrance pupil of the objective, is obtained by means of these steps in order to obtain sufficient brightness of the imaged light point also in the corner areas of the projection surface or assembly surface. This known arrangement has proven successful. However, the cost on construction is rather high. Thus, in order to achieve a sufficiently accurate indication of location, imaging optics must be used which are extensively corrected for distortion and therefore relatively expensive. Simple objectives vary among one another with respect to distortion characteristics, which results in inexact imaging. The described steps for illuminating the pin diaphragm and the objective makes the construction more complicated. Further, the construction cost for the operating mechanism for moving the entire, relatively heavy objective in the two cartesian coordinate directions is relatively high due to the required precision and agility of movement.

The object of the invention consists in providing a projection head of the type named in the beginning which has a sharp light point imaging also in the edge areas of the assembly surface and whose construction is simplified.

This object is met in that the imaging optics comprise an imaging lens or lens group which is attached to the carrier part so as to be stationary, in that the optical element, of which there is at least one, is supported at the carrier part so as to be swivelable, and in that the light source holder, including the point light source, is constructed in such a way that it can be deflected relative to the imaging lens or lens group in the direction of the optical axis as a function of the respective swivel angle of the optical element, of which there is at least one.

The imaging lens or lens group is thus arranged at the carrier part so as to be stationary, so that the illumination of the pin diaphragm and objective requires no particular costly measures. A simple imaging lens or imaging lens group can be used, since the point light source to be imaged remains constantly at the same location on the optical axis. The "image field curvature" is the surface in which are located the image points of the point light source, which are conjugated to form the point light source (substantially stationary object point) and are accordingly sharp-edged, when the beam is deflected by the optical element. The occurrence of this "image field curvature" is unavoidable when using a swivelably supported optical element, of which there is at least one, and would lead to blurred imaging by areas with the usual planar projection surface or assembly surface. The "image field curvature" is at least approximately eliminated by means of the deflection of the point light source in the direction of the optical axis as a function of the respective swivel angle, so that a sharp light point imaging is further ensured.

It has already been suggested to use a laser as a light source and two swivelable mirrors as optical elements which deflect the light beam of the laser and project it onto the assembly surface as a light point (DE-C-27 51 651). The laser ensures a sufficient sharpness of the light point also in the corner areas of the projection surface or assembly surface, since the imaging sharpness remains acceptable, in spite of the distances between the mirrors and projection surface which change depending on the deflecting angle, because of the parallelism and small diameter of the light beam; this would not be the case e.g. in a divergent light beam. However, this known arrangement is disadvantageous not only because of the need to provide a comparatively expensive laser, but also because of the disadvantage of laser light from the standpoint of ergonomics. The laser light point scintillates, so that it appears out-of-focus. It is not white, but monochromatic, so that it cannot be modulated with respect to color. Also, steps must be taken to protect human eyes from dangerous light densities. The arrangement, according to the invention, avoids these disadvantages. Conventional incoherent, divergent light sources can be used, e.g. simple halogen lamps with low output. A simple stationary condenser is sufficient for illuminating the diaphragm forming the light point and the inlet aperture of the objective, since the movement of the diaphragm in the direction of the optical axis amounts to only a few tens of millimeters, depending on the focal length of the objective. Since only a sharp imaging of the light point on the optical axis of the imaging optics is required, imaging lenses or lens groups can be used which are particularly light-intensive and nevertheless inexpensive; distortions outside the optical axis are unimportant. The swivelable mirrors do not require any high-output rotary drive, since the mirror dimensions are determined only according to the diameter of the exit aperture of the imaging lens or lens group and the maximum mirror swivel angles. Relatively small mirror dimensions, and accordingly small mirror masses, are provided in general, so that sufficiently high rotation accelerations can be also achieved at low drive output.

In a further development of the invention, it is suggested that when using a first swivelably movable optical element having a first swivel axis and a second swivelably movable optical element having a second swivel axis perpendicular to the first swivel axis, a first deflecting value is assigned to every swivel angle of the first optical element and a second deflecting value is assigned to every swivel angle of the second optical element, and that the deflection of the point light source is a function of the first and second deflecting values.

It is also suggested that the deflection of the point light source be derived from the sum of the respective first and second deflecting values. This addition, which is basically a scalar addition of the first and second deflecting values, can be realized most simply in a mechanical manner and leads to a sufficient correction of the image field curvature caused by the mirror deflection of the light beam.

Further, at least one lever arrangement is suggested for transforming the swiveling movement of the optical element, of which there is at least one, into a corresponding deflecting movement of the point light source. These lever arrangements render the use of complicated structural elements, e.g. rotation angle sensors and servomotors for the deflection of the light source holder, unnecessary.

Due to the swivelable construction of the carrier part and optical element, of which there is at least one, both parts can be coupled with one another mechanically in a particularly simple manner for correcting the image field curvature, specifically in that the light source holder is connected with the swivelably movable optical element, of which there is at least one, in each instance via a knee joint lever arrangement, the axis of articulation of the knee joint being parallel to the swivel axis of the respective optical element.

The aforementioned scalar addition of the first and second deflecting values can be implemented mechanically in a particularly simple manner in that the light source holder is coupled with an intermediate lever, the knee joint lever arrangement of the first optical element being coupled at one end of the intermediate lever and its other end being coupled with the knee lever arrangement of the second optical element. The knee joint levers are arranged in such a way that they are fully extended when the projection light beam strikes the center of the planar projection surface or assembly surface vertically, and the point light source (pin diaphragm) is accordingly maintained at the greatest possible distance from the imaging lens or lens group. Every deflection from this position by rotation of one or both mirrors in a desired direction shortens the distance between the mirror axes and the intermediate lever and accordingly the distance between the point light source and imaging lens or lens group. This reduction in the object distance leads to an increase in the image distance, so that the light point is now sharply imaged at a great distance from the imaging lens or lens group (objective) - this is also necessary since, as already mentioned, the distance between the light point projected on the assembly surface and the objective becomes greater with each deflection.

A costly linear guide for the deflecting movement of the carrier part in the direction of the optical axis can be dispensed with if, in a further development of the invention, the latter is arranged at the carrier part so as to be swivelable, preferably via a leaf spring. In the rest position, the light source holder is aligned vertically with respect to the optical axis. The movement components of the punctiform light source vertical to the optical axis which occur during the swiveling movement from the rest position can be ignored due to the short movement path in the direction of the optical axis with small lever lengths.

It is suggested that the light source holder be connected with the intermediate lever via a swivel joint in the area between the two ends of the intermediate lever. It can be provided that the two knee joint lever arrangements be connected in an articulated manner in each instance with the intermediate lever. This type of construction is simple to produce and functions in a reliable manner, since it is only necessary to construct joints. The scalar addition of the deflecting values is ensured.

In order to carry out the swivel angle adjustment of the respective optical element with high accuracy and simple construction, it is suggested in addition to, or as an alternative to, the solution described above that the swivelable optical element, of which there is at least one, be coupled with a drag lever, that the drag lever comprise a cam projection, and that the cam projection act at a cam surface of a motor-driven drive pulley. In order to obtain a high step-down ratio, it is suggested that the drive pulley be provided with a helical groove forming a cam surface. For a simple connection of the drive pulley with a drive motor, preferably a step motor, it is suggested that the drive pulley be connected with a drive motor via a belt drive.

As a result of the high achievable step-down ratio, the drag lever can be rigidly connected with the swivelable optical element, particularly mirrors, which in turn contributes to the simple construction. Small and inexpensive step motors with low step number per revolution can be used—nevertheless, because of the high step-down ratio, a very small, practically invisible step size of the light point projected on the assembly surface can be obtained.

It is further suggested that the swivelably supported drag lever be pretensioned in one of the two swiveling directions by means of a spring element. This simple measure ensures that the cam projection constantly presses against the cam surface so as to be free of play, wherein the cam projection can have play inside the helical groove, which ensures ease of movement of the cam projection inside the helical groove; the helical groove need not be manufactured so precisely that the cam projection runs in the helical groove so as to be substantially free of play.

A limit switch which can be actuated by the drag lever can be provided so as to switch off the drive motor when exceeding predetermined limiting swivel angles.

Figure 2:
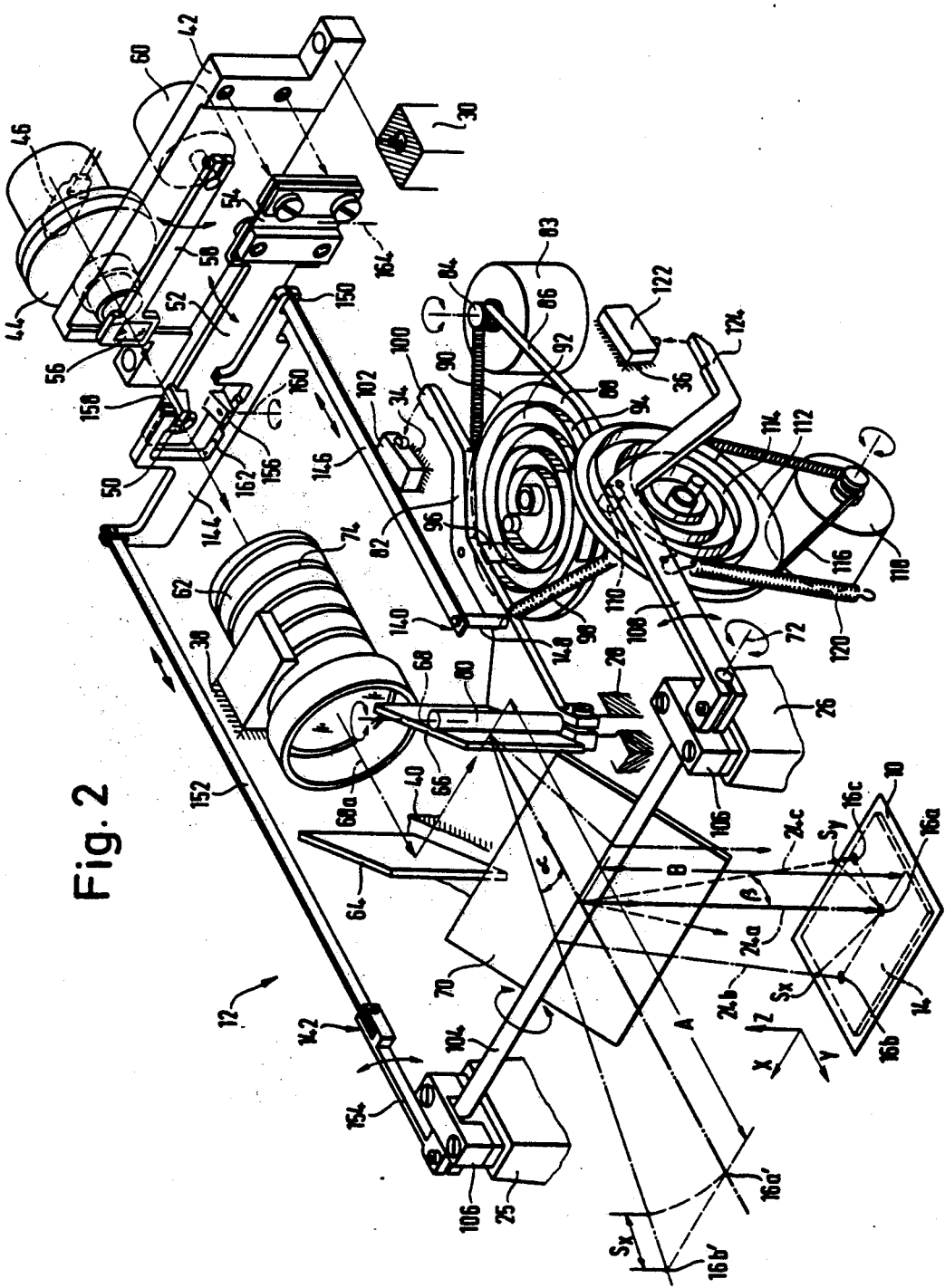

The invention is discussed in the following by way of example with the aid of FIGS. 1 and 2:

FIG. 1 shows a simplified top view of a projection head, according to the invention, with removed housing cover; and FIG. 2 shows an isometric basic drawing of essential structural elements of the projection head.

The projection head which is shown in a simplified manner in the drawing can be part of an assembly table as described e.g. in DE-A-27 16 548. The projection head 12, which is arranged at a distance from an assembly surface (indicated at the lower left-hand side in FIG. 2) above this surface 10, serves to project a light point 16 on the assembly surface 10, or on a circuit board 14 placed on the assembly surface, as an indication for the person working at the assembly table that that is the location where the next electronic component, which was prepared elsewhere, is to be attached. However, the arrangement, according to the invention, can also be used in other cases involving a sharp-outlined imaging of a light point or similar elementary light formation, e.g. a circle, cross, arrow or the like, on a relatively large surface in various light point positions.

The projection head 12 comprises an approximately plate-shaped carrier part 18 with a laterally raised, stepped edge 20 for the placement of a position head hood, omitted in the drawings. The carrier part 18 is provided with a rectangular opening 22 through which the light beam 24 generated in the projection head 12 extends vertically downward until it strikes the surface 10. Fastening bases 25, 26, 28, 30, 32, 34, 36, 38 and 40, indicated in FIGS. 1 and 2, for fastening the inner structural component parts of the projection head 12 are constructed in one piece with the carrier part 18.

A bridge 42, which supports a lamp housing 44, is rigidly fastened to the bases 30 and 32. Provided in the lamp housing 44 is an illumination source, e.g. in the form of a halogen lamp 46, as well as a collecting lens 48, indicated with a dashed line in FIG. 1, which concentrate the beams proceeding from the lamp 46 on the diaphragm opening of a pin diaphragm 50. The diameter of the collecting lens (condenser lens) 48 is determined in such a way that the light cone proceeding from the diaphragm part completely illuminates the entrance opening of a subsequently arranged objective 62 in order to obtain the greatest possible brightness of the light point on the assembly surface 10. The pin diaphragm 50 is constructed at an arm-like light source holder 52, particularly by making a corresponding fine through-bore hole in the carrier part 52. The carrier part 52 is fastened at the bridge 42 via a leaf spring 54 serving as a swivel joint with vertical axis of rotation.

In order to obtain a colored light beam, a color filter plate 56 can be swiveled in the beam path between the lamp 46 and the pin diaphragm 50 at the free end of a swivelably supported arm 58 which is driven via an electric motor 60.

The opening of the pin diaphragm 50 which is illuminated from the back by means of the lamp 46 forms an approximately punctiform light source which emits a divergent light and is projected with sharp edges on the assembly surface 10, or on a circuit board 14 resting on the surface 10, via the imaging objective 62, a stationary mirror 64, then via a first swivel mirror 66 with vertical swivel axis 68, and finally via a second swivel mirror 70 with horizontal swivel axis 72. Thus, the swivel axes 68 and 72 lie in a skewed manner and at right angles relative to one another. The light point 16 is therefore the image of the opening of the pin diaphragm 50 forming the object, which pin diaphragm 50 is illuminated from the rear. In the arrangement shown in the drawing, the light beam 24 runs, proceeding from the pin diaphragm 50, in a substantially horizontal plane parallel to the surface 10 through the objective 62, wherein it is then deflected by 90° via the mirror 64 which is arranged in the vertical plane and is guided to the center of the swivelable mirror 66. In the neutral position, shown in the drawing, of the first swivel mirror 66 in which the swivel mirror 66 is arranged parallel to the mirror 64, the light beam is therefore deflected in the horizontal plane by 90°, so that it again runs parallel to the optical axis 68a of the objective 68 and then strikes the mirror 70. The latter guides it downward by 90° in the neutral position, likewise shown, so that it strikes the center of the assembly surface 10, where it is visible as an enlarged image of the light point diaphragm or pin diaphragm 50. If mirror 66 or mirror 70 is swiveled out of the respective neutral position the light point wanders on the assembly surface 10 in the X direction or in the Y direction, so that every location on the assembly surface 10 is reachable by adjusting a swivel angle pair assigned to it for the swivel mirrors 66 and 70. Thus, such a swivel angle pair is assigned in an unequivocal manner to every location on the assembly surface.

The objective 62 is mounted at the fastening base 38. The objective 62 is designed so as to be adjustable in the direction of its optical axis for a one-time focussing corresponding to the distance between the projection head and the surface 10, or object to be equipped which is lying on the surface. For this purpose, the objective can be provided with an outer circumferential helical groove 74 in which a guide pin 76 projecting at the fastening base engages. A curved leaf spring 78, which can be seen in FIG. 1, presses the outer circumference of the objective 62 against the corresponding support surface of the fastening base 38.

The swivel mirror 66 with vertical rotational axis 68 is swivelably supported at a shaft 80 fastened at the base 28. It is rigidly connected with a drag lever 82 which can be swiveled, as desired, around the axis 68 by an electric motor, particularly a step motor 83. For this purpose, a drive shaft 84 of the electric motor 83 is connected with a drive pulley 88 via a toothed belt 86, wherein the toothed belt 86 runs on the outer circumference 90 of the toothed disk 88 which is provided with ribbing corresponding to the toothing of the toothed belt 86.

The drive pulley 88 is constructed with a web 94 forming a helical groove 92. A cam projection 96, particularly in the form of a cam roller, which projects down from the drag lever 82, engages in this helical groove. A helical tension spring 98 pretensions the drag lever 82 in the clockwise direction of FIGS. 1 and 2, so that the cam projection 96 constantly contacts a flank of the helical groove 92 (the upper flank in FIG. 1) so as to be free of play.

The free end 100 of the drag lever 82 serves for actuating a limit switch 102, which is provided at the base 34, in one of the two end positions of the swivel lever 82.

The second swivel mirror 70 is rigidly arranged at a horizontally extending swivel shaft 104. The two ends of the swivel shaft 104 are supported at the two bases 25 and 26 via a swivel bearing 106 in each instance so as to be rotatable around the axis 72. In order to swivel the swivel mirror 70, the shaft 104 is rigidly connected with a drag lever 108 which in turn engages with a cam projection 110 in the form of a cam roller in a helical groove 114 constructed at a second drive pulley 112. The drive pulley 112 can be driven, in turn, via a toothed belt 116 by means of an electric motor, particularly a step motor 118, in one direction or the other, as desired. The participating swivel and rotation axes of the shaft 104, drive pulley 112 and electric motor 118 are naturally arranged parallel to one another for this purpose.

In this instance also, a helical tension spring 120 also ensures that the cam projection 110 contacts a flank of the helical groove 114 so as to be free of play. A limit switch 122 fastened at the base 36 is actuated in one of the two end swivel positions of the drag lever 108 by the free lever end 124.

The two limit switches 102 and 122 report a known position of the respective drag lever 82;108 which serves as a reference for finding desired light point locations on the assembly surface 10.

It is important for the use of the projection head that the light point 16 have sharp edges and that it not appear blurred in all possible positions on the surface 10 or of the circuit board 14 to be outfitted. In the present arrangement with swivel mirrors, however, the length traversed by the light beam between the pin diaphragm 50 and the surface 10 or circuit board 14 changes when the light point position changes. It will be noticed that the beam 24a indicated in a bold dash-dot line in FIG. 2, which is obtained in the neutral position of the two swivel mirrors 66 and 70, strikes the point 16a on the surface 10. If the swivel mirror 66 is then swiveled around the angle α, the light point on the surface shifts in direction X from point 16a to point 16b. In order to simplify the derivation of the difference of beam path, the linear course of the beam with the omission of the swivel mirror 70 is indicated in FIG. 2 with a dash-dot-dot line. The end point 16a' of the neutral beam 24a (deflecting angle 90° through the swivel mirror 66) has a distance A from the point of incidence of the beam from the swivel mirror 66, which corresponds to the sum of the distance traversed by the beam 24a between the swivel mirror 66 and the swivel mirror 70 and between the swivel mirror 70 and the surface 10. The difference in distances traversed by the beam 24a and the beam 24b, which is deflected by the angle α, is designated in FIG. 2 by $S_x$ and has the following value:

$$S_x = A\left(\frac{1}{\cos \alpha} - 1\right).$$

An "image field curvature" is therefore obtained in the X, Z plane along a circular arc with radius A when the swivel mirror 60 is swiveled.

A corresponding "image field curvature" in the Y, Z plane along a circular arc with a radius corresponding to the distance B between the point of incidence of the beam on the swivel mirror 70 and the surface 10 is given when the swivel mirror 70 is swiveled. The corresponding difference in lengths traversed by the neutral beam 24a and the beam 24c, which is deflected by the mirror 70 at an angle β with point 16c of incidence on the surface 10, is designated by $S_y$ in FIG. 2 and has the following value:

$$S_y = B\left(\frac{1}{\cos \beta} - 1\right).$$

Since B is not equal to A, there is an "image field curvature" which is not rotationally symmetrical as soon as the two angles α and β are varied.

In order nevertheless to obtain a sharp imaging of the point light source on the entire surface 10 or on the circuit board 14, the distance of the pin diaphragm 50 from the objective 62, i.e. the object length, is changed as a function of the swivel angles of the two mirrors 66 and 70 and accordingly as a function of the distance traversed by the beam 24 between the objective and the surface 10, which distance represents the respective effective image distance.

For this purpose the two swivel mirrors 66 and 70 are connected with an intermediate lever 144 in each instance via a knee joint lever arrangement 140 and 142, respectively, which in turn acts at the light source holder 52.

The knee joint lever arrangement 140 is formed on the one hand by the intermediate lever and on the other hand by a connecting arm 146 whose one end is connected, via a vertical pivot pin 148, with the drag lever 82 (knee joint), its other end acting at one end of the elongated intermediate lever 144, likewise via a swivel joint 150.

The elongated intermediate lever 144 is arranged so as to lie in a horizontal plane transversely relative to the axis 68a of the objective 62. Its other end is connected in an articulated manner with one end of a connecting arm 152 whose other end, in turn, acts in an articulated manner with a lever arm 154 which is attached at the shaft 104 so as to be fixed with respect to rotation relative to it. The articulation axes of the connecting arm 152 at its two ends extend parallel to the axis 72 of the shaft 104.

In a center area of the intermediate lever 144, the latter is connected in an articulated manner with the light source holder 52 via articulated projections 156, 158 with vertical axis 160 of rotation. A cut out portion 162 in the intermediate lever 144 in FIG. 2 permits the unimpeded passage of the light proceeding from the opening of the pin diaphragm 50 in the direction of the entrance pupil of the objective 62. The intermediate lever 144 serves as a mechanical adder for the deflections brought about by the two knee lever arrangements 140 and 142.

If, for example, only the knee joint lever arrangement 142 is adjusted, the intermediate lever 144 swivels correspondingly around the swivel joint 150. In accordance with the ratio of the distances between the swivel axis 160 and the two ends of the intermediate lever 144, the shifting of the left-hand end, in FIG. 2, of the intermediate lever 144 by the deflecting value W leads to a shifting of the swivel axis 60, and accordingly of the light source holder 52, including the pin diaphragm 50, by a correspondingly reduced value, chiefly in the direction of the optical axis (in the event that the swivel axis 160 is located in the longitudinal center of the intermediate lever 144, its displacement is equal to half the deflecting value W).

If the knee joint lever arrangement 140 is adjusted in addition, there is a corresponding swiveling movement of the intermediate lever 144 around the lever end situated at the upper left-hand side in FIG. 2 with a corresponding shifting of the pin diaphragm 50. As a result, there is a shifting of the pin diaphragm 50 in the direction of the optical axis by a value corresponding to a weighted sum of the deflecting values of the two knee joint lever arrangements 140 and 142.

If e.g. the swivel mirror 66 is now swiveled out of its neutral position, shown in FIG. 2, by a 90° deflection of the light beam 24 in one direction or the other, the knee joint of the articulated arrangement 140, which knee joint is extended in the neutral position, (swivel axes between the parts 144,146;82 and 80 aligned with one another) is bent in the corresponding direction; as a result, the swivel joint 150 between the arm 146 and the intermediate lever 144 increasingly approximates the swivel axis 68 of the mirror 66. This results in a corresponding swiveling movement of the light source holder 52 around its swivel axis 164 formed by the leaf spring 54 in the counterclockwise direction with respect to FIGS. 1 and 2. The object distance is accordingly reduced. This results in a corresponding increase in the image distance, in accordance with the laws governing imaging, so that the lengthening of the beam path on the image side can be compensated for based on the swiveling of the mirror 66. Accordingly, if the light point 16a produced by the beam 24a is focussed, the light point 16b is also focussed after the swiveling of the mirror 66.

In a corresponding manner, a swiveling movement of the mirror 70 with a 90° deflection vertically downward from its neutral position, shown in FIG. 2, and extended knee joint of the knee joint lever arrangement 142 also leads to a bending of the knee joint and consequently to a swiveling of the intermediate lever 144 around its end remote of the connection lever 152 in the counterclockwise direction of FIG. 2. The light source holder 52 then likewise swivels in the counterclockwise direction of FIG. 2 with a corresponding reduction of the object distance. A mathematically exact focussing readjustment in a first approximation can be achieved for every deflection direction X, respectively, Y, as seen separately, by means of correspondingly determining the lever lengths of the knee joint lever arrangement 142 as well as the ratio of the distances between the swivel axis 160 and one or the other end of the intermediate lever 144. With simultaneous deflection of the light point in the X and Y directions, there is no longer a mathematically exact focussing readjustment due to the scalar addition of the X-Y adjusting paths via the intermediate lever 144; but the solution which is described above and which is to be realized in a particularly simple construction is sufficient for readjusting the sharpness of the light point with sufficient accuracy within a surface area of 0.6×0.6 m, e.g. with a position head distance of 1 meter from the assembly surface 10.

I claim:

1. Projection head for a light point (16) on a surface (10), particularly on an assembly surface of an assembly table for indicating the outfitting location, comprising a carrier part (18), a point light source, particularly in the form of a pin diaphragm (50) which is illuminated from the rear, a holder (52) for the point light source, which is arranged at the carrier part (18) so as to be movable, and imaging optics arranged at the carrier part (18) for imaging the point light source, as light point (16), on the surface (10) with at least one optical element, which is attached to the carrier part (18) so as to be movable, for shifting the light point (16) on the surface (10), as desired, characterized in that the imaging optics comprise an imaging lens or lens group (63) which is attached at the carrier part (18) so as to be stationary, said at least one optical element being supported at the carrier part (18) so as to be swivelable, and the holder (52) being coupled to said at least one optical element for movement of said holder (52) in the direction of the optical axis in dependence on the swivel movement of the at least one optical element.

2. Projection head according to claim 1, characterized in that when using a first swivelably movable optical element, preferably a swivel mirror (70), having a first swivel axis (72) and a second swivelably movable optical element, preferably swivel mirror (66), having a second swivel axis (68) perpendicular to the first swivel axis (72), a first deflecting value is assigned to every swivel angle of the first optical element and a second deflecting value is assigned to every swivel angle of the second optical element, and in that the deflection of the point light source is a function of the respective first and second deflecting values.

3. Projection head according to claim 2, characterized in that the deflection of the point light source is derived from a sum of the respective first and second deflecting values.

4. Projection head according to claim 2, characterized by at least one lever arrangement (140, 142, 144) for transforming the swiveling movement of the at least one optical element into a corresponding deflecting movement of the point light source.

5. Projection head according to claim 4, characterized in that the light source holder (52) is connected with the at least one optical element via a knee joint lever arrangement (140, 142), the axis of articulation of the knee joint being parallel to the swivel axis of the respective optical element.

6. Projection head according to claim 5, characterized in that the light source holder (52) is coupled with an intermediate lever (144), the knee joint lever arrangement (142) of the first optical element being coupled at one end of the intermediate lever (144) and its other end being coupled with the knee lever arrangement (140) of the second optical element.

7. Projection head according to claim 6, characterized in that the light source holder (52) is connected with the intermediate lever (144) via a swivel joint in the area between the two ends of the intermediate lever (144).

8. Projection head according to claim 6, characterized in that the two knee joint lever arrangements (140, 142) are connected in an articulated manner, in each instance, with the intermediate lever (144).

9. Projection head according to claim 1, characterized in that the light source holder (52) is arranged at the carrier part (18) so as to be swivelable.

10. Projection head according to claim 9, characterized in that the light source holder (52) is connected with the carrier part (18) via a leaf spring (54).

11. Projection head according to claim 1, characterized in that the at least one swivelable optical element is coupled with a drag lever (82;108), the drag lever (82;108) comprising a cam projection (96;110), and the cam projection (96;110) acting at a cam surface of a motor-driven drive pulley (88;112).

12. Projection head according to claim 11, characterized in that the drive pulley (88;112) is provided with a helical groove (92; 114) forming the cam surface.

13. Projection head according to claim 11 or 12, characterized in that the drive pulley (88;112) is connected with a drive motor (83;118) via a belt drive.

14. Projection head according to claim 11, characterized in that the drag lever (82; 108) is rigidly connected with the swivelable optical element.

15. Projection head according to claim 11, characterized in that the swivelably supported drag lever (82; 108) is pretensioned in one of the two swiveling directions by means of a spring element (98; 120).

16. Projection head according to claim 11, characterized by a limit switch (102, 122) which can be actuated by the drag lever (82;108).

17. Projection head for a light point (16) on a surface (10), particularly on an assembly surface of an assembly table for indicating the outfitting location, comprising:
a carrier part (18);
a point light source, particularly in the form of a pin diaphragm (50) which is illuminated from the rear;
a holder (52) for the point light source, which is arranged at the carrier part (18) so as to be movable; and
imaging optics arranged at the carrier part (18) for imaging the point light source, as light point (16), on the surface (10) with at least one optical element, which is attached to the carrier part (18) so as to be swivelable, for shifting the light point (16) on the surface (10), as desired, characterized in that the at least one swivelable optical element is coupled with a drag lever (82;108) that has a cam projection (96;110) that acts at a cam surface of a motor-driven drive pulley (88;112).

18. Projection head according to claim 17, characterized in that the drive pulley (88;112) is provided with a helical groove (92;114) forming the cam surface.

19. Projection head according to claim 17, characterized in that the drive pulley (88;112) is connected with a drive motor (83;118) via a belt drive.

20. Projection head according to claim 17, characterized in that the drag lever (82;108) is rigidly connected with the swivelable optical element.

21. Projection head according to claim 17, characterized in that the drag lever (82;108) is pretensioned in one of the two swiveling directions by means of a spring element (98;120).

22. Projection head according to claim 17, characterized by a limit switch (102, 122) which can be actuated by the drag lever (92;108).

* * * * *